US012218698B2

United States Patent
Lisboa et al.

(10) Patent No.: US 12,218,698 B2
(45) Date of Patent: *Feb. 4, 2025

(54) FILE COMPRESSION SYSTEM

(71) Applicant: DRIC Software, Inc., Orlando, FL (US)

(72) Inventors: Ricardo Fioravante Lisboa, Rio de Janeiro (BR); Rafael Sarmento Freijanes, Rio de Janeiro (BR); Adalberto Diego Cassinera, Kenmore, WA (US)

(73) Assignee: DRIC Software, Inc., Orlando, FL (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/347,400

(22) Filed: Jul. 5, 2023

(65) Prior Publication Data

US 2024/0187020 A1 Jun. 6, 2024

Related U.S. Application Data

(63) Continuation of application No. 17/702,574, filed on Mar. 23, 2022, now Pat. No. 11,742,877.

(Continued)

(51) Int. Cl.
*H03M 7/40* (2006.01)
(52) U.S. Cl.
CPC .................... *H03M 7/405* (2013.01)
(58) Field of Classification Search
CPC ..................................... H03M 7/405
See application file for complete search history.

(56) References Cited

U.S. PATENT DOCUMENTS 5,838,963 A * 11/1998 Griffiths ............... H03M 7/3088
6,188,797 B1 * 2/2001 Moledina ................ G06T 9/005
358/1.9

(Continued)

FOREIGN PATENT DOCUMENTS

WO 2021138725 A1 7/2021

OTHER PUBLICATIONS

Notice of Allowance mailed Apr. 5, 2023, for U.S. Appl. No. 17/702,574, filed Mar. 23, 2022, eight pagers.

*Primary Examiner* — Lam T Mai
(74) *Attorney, Agent, or Firm* — Morrison & Foerster LLP

(57) ABSTRACT

Examples of the disclosure describe systems and methods for implementing a file compression system. In an example method, a source string to be compressed is received. The source string comprises a plurality of characters. A first frequency is determined for each character of the plurality of characters of the source string. A first tree corresponding to the source string is determined based on the first frequencies. The source string is encoded using the first tree to generate a first encoded string. It is determined whether a total number of bits in the first encoded string is a multiple of eight. In accordance with a determination that the total number of bits in the first encoded string is not a multiple of eight, the first encoded string is appended with zeroes so that a new total number of bits in the first encoded string is a multiple of eight. In accordance with a determination that the total number of bits in the first encoded string is a multiple of eight, the method forgoes appending the first encoded string with zeroes. The first encoded string is divided into one or more eight-bit segments and a placeholder character is assigned to each eight-bit segment. A second frequency for each of the placeholder characters in the first encoded string is determined. A second tree corre- (Continued)

sponding to the first encoded string is determined based on the second frequencies. The first encoded string is encoded using the second tree to generate a second encoded string.

20 Claims, 12 Drawing Sheets

Related U.S. Application Data

(60) Provisional application No. 63/168,797, filed on Mar. 31, 2021.

(56) References Cited

U.S. PATENT DOCUMENTS

| | | | |
|---|---|---|---|
| 6,886,161 B1 * | 4/2005 | Garvin | G06F 8/70 |
| | | | 717/175 |
| 7,478,746 B2 | 1/2009 | Cattrone | |
| 8,096,480 B2 | 1/2012 | Lee et al. | |
| 8,542,939 B2 * | 9/2013 | Nystad | H04N 19/96 |
| | | | 382/240 |
| 9,111,161 B2 | 8/2015 | Ming et al. | |
| 9,111,186 B2 | 8/2015 | Blasinski et al. | |
| 9,258,013 B1 * | 2/2016 | Chau | H03M 7/40 |
| 9,979,948 B2 * | 5/2018 | Jiang | H04N 13/161 |
| 11,126,594 B2 * | 9/2021 | VanderSpek | G06F 16/1744 |
| 11,742,877 B2 * | 8/2023 | Lisboa | H03M 7/405 |
| | | | 341/65 |
| 2009/0309769 A1 * | 12/2009 | Au | H04L 9/002 |
| | | | 341/51 |
| 2012/0033239 A1 * | 2/2012 | Varga | H04N 1/3333 |
| | | | 358/1.9 |
| 2014/0285487 A1 * | 9/2014 | Cai | H04N 19/70 |
| | | | 345/420 |
| 2014/0340246 A1 * | 11/2014 | Wu | H04N 19/91 |
| | | | 341/65 |
| 2015/0108220 A1 | 4/2015 | Gu et al. | |

* cited by examiner

```
BEGIN
    Bits = bitStream;
    blockOfBits = 0;
    sizeofBits = lenghtOfbitStream;
    a = 1;
    while (blockOfBits < low)
    {
        ingress 1 to the bit
        if (blockOfBits >= high)
            replace the bit by 0
        a = a + 1;
    }
END
```

FIG. 3A

```
BEGIN
    blockBegin = 0;
    blockEnd = 1;
    blockRange = 1;
    Bits = bitStream;
    while (blockOfBits != end)
    {
        get(each(Bits));
        blockBegin = blockBegin + blockRange * Range_low(Bits);

blockEnd = blockBegin + blockRange * Range_high(Bits);
        blockRange = blockEnd - blockBegin;

}
    show: blockBegin <= blockOfBits < blockEnd;
END
```

"Hello my name is Diego."

| Weight | Char | Hex | Bin |
|---|---|---|---|
| 4 | Space | 20 | 00100000 |
| 3 | e | 65 | 01100101 |
| 2 | i | 69 | 01101001 |
| 2 | l | 6c | 01101100 |
| 2 | m | 6d | 01101101 |
| 2 | o | 6f | 01101111 |
| 1 | . | 2e | 00101110 |
| 1 | D | 44 | 01000100 |
| 1 | H | 48 | 01001000 |
| 1 | a | 61 | 01100001 |
| 1 | g | 67 | 01100111 |
| 1 | n | 6e | 01101110 |
| 1 | s | 73 | 01110011 |
| 1 | y | 79 | 01111001 |

| Weight | Char | Hex | Bin | Short Code |
|---|---|---|---|---|
| 4 | Space | 20 | 00100000 | 101 |
| 3 | e | 65 | 01100101 | 100 |
| 2 | i | 69 | 01101001 | 1111 |
| 2 | l | 6c | 01101100 | 1100 |
| 2 | m | 6d | 01101101 | 1110 |
| 2 | o | 6f | 01101111 | 1101 |
| 1 | . | 2e | 00101110 | 0111 |
| 1 | D | 44 | 01000100 | 0101 |
| 1 | H | 48 | 01001000 | 0000 |
| 1 | a | 61 | 01100001 | 0011 |
| 1 | g | 67 | 01100111 | 0110 |
| 1 | n | 6e | 01101110 | 0011 |
| 1 | s | 73 | 01110011 | 0100 |
| 1 | y | 79 | 01111001 | 0001 |

| Weight | Char | Bin | Hex |
|---|---|---|---|
| 1 | A | 00001001 | 09 |
| 1 | B | 10011001 | 99 |
| 1 | C | 10110111 | B7 |
| 1 | D | 10000110 | 86 |
| 1 | E | 10010001 | 91 |
| 1 | F | 11110100 | F4 |
| 1 | G | 10111110 | BE |
| 1 | H | 10010101 | 95 |
| 1 | I | 01111110 | 7E |
| 1 | J | 00110110 | 36 |
| 1 | K | 10111000 | B8 |

| M0 | M1 | M2 | M3 | M4 | M5 | M6 | M7 | M8 | M9 | M10 | M11 |
|---|---|---|---|---|---|---|---|---|---|---|---|
| A0 | B0 | C0 | D0 | E0 | F0 | G0 | H0 | I0 | J0 | K0 | L0 |
| A1 | B1 | C1 | D1 | E1 | F1 | G1 | H1 | I1 | J1 | K1 | L1 |
| A2 | B2 | C2 | D2 | E2 | F2 | G2 | H2 | I2 | J2 | K2 | L2 |
| A3 | B3 | C3 | D3 | E3 | F3 | G3 | H3 | I3 | J3 | K3 | L3 |
| A4 | B4 | C4 | D4 | E4 | F4 | G4 | H4 | I4 | J4 | K4 | L4 |
| 25 | 50 | 75 | 25 | 25 | 50 | 75 | 25 | 25 | 50 | 75 | 25 |
| R | G | B | B | R | G | B | B | R | G | B | B |

| M12 | M13 | M14 | M15 | M16 | M17 | M18 | M19 | M20 | M21 | M22 | M23 |
|---|---|---|---|---|---|---|---|---|---|---|---|
| M0 | N0 | O0 | P0 | Q0 | R0 | S0 | T0 | U0 | V0 | W0 | X0 |
| M1 | N1 | O1 | P1 | Q1 | R1 | S1 | T1 | U1 | V1 | W1 | X1 |
| M2 | N2 | O2 | P2 | Q2 | R2 | S2 | T2 | U2 | V2 | W2 | X2 |
| M3 | N3 | O3 | P3 | Q3 | R3 | S3 | T3 | U3 | V3 | W3 | X3 |
| M4 | N4 | O4 | P4 | Q4 | R4 | S4 | T4 | U4 | V4 | W4 | X4 |
| 25 | 50 | 75 | 25 | 25 | 50 | 75 | 25 | 25 | 50 | 75 | 25 |
| R | G | B | B | R | G | B | B | R | G | B | B |

| M24 | M25 | M26 | M27 | M28 | M29 | M30 | M31 | M32 | M33 | M34 | M35 |
|---|---|---|---|---|---|---|---|---|---|---|---|
| Y0 | Z0 | 0 | 1 | 2 | 3 | 4 | 5 | 6 | 7 | 8 | 9 |
| Y1 | Z1 | 0 | 1 | 2 | 3 | 4 | 5 | 6 | 7 | 8 | 9 |
| Y2 | Z2 | 0 | 1 | 2 | 3 | 4 | 5 | 6 | 7 | 8 | 9 |
| Y3 | Z3 | 0 | 1 | 2 | 3 | 4 | 5 | 6 | 7 | 8 | 9 |
| Y4 | Z4 | 0 | 1 | 2 | 3 | 4 | 5 | 6 | 7 | 8 | 9 |
| 25 | 50 | 75 | 25 | 25 | 50 | 75 | 25 | 25 | 50 | 75 | 25 |
| R | G | B | B | R | G | B | B | R | G | B | B |

FIG. 7

FILE COMPRESSION SYSTEM

CROSS-REFERENCE TO RELATED APPLICATION

This application is a continuation of U.S. application Ser. No. 17/702,574, filed Mar. 23, 2022, which claims the benefit of U.S. Provisional Application No. 63/168,797, filed on Mar. 31, 2021, which are hereby incorporated by reference in their entirely.

FIELD OF THE DISCLOSURE

This disclosure generally relates to a file compression system, and more specifically, to a system to encode and decode files with increased efficiency.

BACKGROUND OF THE DISCLOSURE

Current data encoding technologies may limit data storage and data transfer capabilities. For example, Quick Response (QR) code based images may allow for the storage of 4296 characters of data. As another example, single-level Huffman encoding-based data compression platforms may limit lossless data compression. Furthermore, more aggressive file compression techniques may cause parts of the data to be corrupted or missing. The current data encoding technologies may reduce data storage and/or data transfer efficiency (e.g., the compressed files may still be too large for storage and/or transfer). Therefore, what may be desired is more reliable data compression and encoding technology that allows for increased data compression, data storage efficiency, and/or data transfer efficiency, compared to compared to solutions implemented with QR code or Huffman encoding techniques.

BRIEF SUMMARY OF THE DISCLOSURE

Described herein are systems and methods for providing efficient and accurate data compression, storage, transfer, and decoding. The systems and methods use techniques relating to Huffman encoding and bi-dimensional images. The encoding and decoding of a source file may be performed by using a master tree or a portion of the master tree, created using a recursive Huffman technique, to create a compressed code, which has higher average compression rate, compared to current data encoding technologies. In some embodiments, the recursive Huffman technique can be performed in more than one direction (e.g., up a tree, down a tree). Additionally, a multi colored bi-dimensional image may be used to store and represent the compressed code.

Examples of the disclosure describe systems and methods for implementing a file compression system. In an example method, a source string to be compressed is received. The source string comprises a plurality of characters. A first frequency is determined for each character of the plurality of characters of the source string. A first tree corresponding to the source string is determined based on the first frequencies. The source string is encoded using the first tree to generate a first encoded string. It is determined whether a total number of bits in the first encoded string is a multiple of eight. In accordance with a determination that the total number of bits in the first encoded string is not a multiple of eight, the first encoded string is appended with zeroes so that a new total number of bits in the first encoded string is a multiple of eight. In accordance with a determination that the total number of bits in the first encoded string is a multiple of eight, the method forgoes appending the first encoded string with zeroes. The first encoded string is divided into one or more eight-bit segments and a placeholder character is assigned to each eight-bit segment. A second frequency for each of the placeholder characters in the first encoded string is determined. A second tree corresponding to the first encoded string is determined based on the second frequencies. The first encoded string is encoded using the second tree to generate a second encoded string.

BRIEF DESCRIPTION OF THE DRAWINGS

FIGS. 3A-3B illustrate examples of encoding and decoding, according to embodiments of the disclosure.

FIGS. 4A-4I illustrate an exemplary recursive data compressing process, according to embodiments of the disclosure.

FIG. 7 illustrates an exemplary code table, according to embodiments of the disclosure.

DETAILED DESCRIPTION OF THE INVENTION

Figure 1:
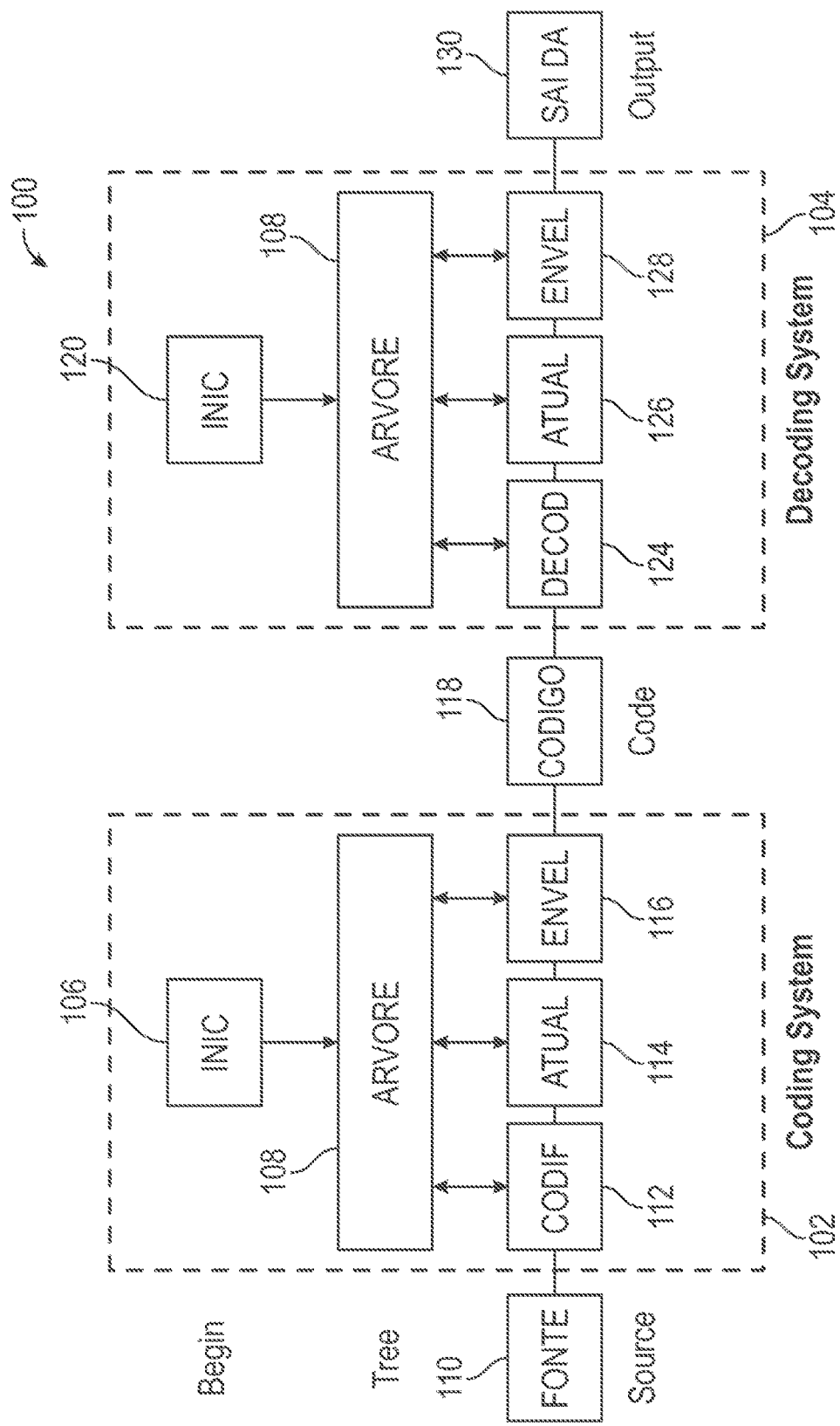
FIG. 1 illustrates a block diagram of an exemplary data compression system, according to embodiments of the disclosure.

The following description is presented to enable a person of ordinary skill in the art to make and use various embodiments. Descriptions of specific devices, techniques, and applications are provided only as examples. These examples are being provided solely to add context and aid in the understanding of the described examples. It will thus be apparent to a person of ordinary skill in the art that the described examples may be practiced without some or all of the specific details. Other applications are possible, such that the following examples should not be taken as limiting. Various modifications in the examples described herein will be readily apparent to those of ordinary skill in the art, and the general principles defined herein may be applied to other examples and applications without departing from the spirit and scope of the various embodiments. Thus, the various embodiments are not intended to be limited to the examples described herein and shown, but are to be accorded the scope consistent with the claims.

Various techniques and process flow steps will be described in detail with reference to examples as illustrated in the accompanying drawings. In the following description, numerous specific details are set forth in order to provide a thorough understanding of one or more aspects and/or features described or referenced herein. It will be apparent, however, to a person of ordinary skill in the art, that one or more aspects and/or features described or referenced herein may be practiced without some or all of these specific details. In other instances, well-known process steps and/or structures have not been described in detail in order to not obscure some of the aspects and/or features described or referenced herein.

In the following description of examples, reference is made to the accompanying drawings which form a part hereof, and in which it is shown by way of illustration specific examples that can be practiced. It is to be understood that other examples can be used and structural changes can be made without departing from the scope of the disclosed examples.

The terminology used in the description of the various described embodiments herein is for the purpose of describing particular embodiments only and is not intended to be limiting. As used in the description of the various described embodiments and the appended claims, the singular forms "a," "an," and "the" are intended to include the plural forms as well, unless the context clearly indicates otherwise. It will also be understood that the term "and/or" as used herein refers to and encompasses any and all possible combination of one or more of the associated listed items. It will be further understood that the terms "includes." "including." "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

FIG. 1 depicts an exemplary system 100, which is an embodiment of a file compression system according to the present disclosure. In some embodiments, the components of the system 100 are implemented using hardware (e.g., a processor and a memory) and/or software (e.g., a file compression application, a file encoding application, a file decoding application) stored in or executed by the hardware. For example, instructions may be stored in the memories of the system 100, and the operations of the components of the system 100 and/or the methods disclosed herein are performed when the instructions are executed by processors of the system 100.

The system 100 may include an encoder 102 and a decoder 104, which may perform encoding and decoding operations on a source string 110, respectively, using a tree 108 (e.g., a Huffman tree) as a reference. The tree 108 may be stored and maintained by both the encoder 102 and the decoder 104. In some embodiments, the encoding or the decoding process may take a few seconds to five minutes, depending on the size of the file being compressed. For example, the processing time may vary depending on file content (e.g., of the source file 110). As another example, the processing time may vary depending on file content and the file size (e.g., of the source file 110), with file content having a greater effect on the processing time.

In some embodiments, the encoder 102 comprises an INIC block 106, which creates and initializes the tree 108. The source file 110 is the original file, which can be encoded for file compression. The source file 110 may be received for encoding by the CODIF block 112.

In some embodiments, the source file 110 is a file up to 2 GB. In some embodiments, the source file 110 includes one or more files. The source file 110 may be one or more of an image file (e.g., .png, .jpg, .gif, .bmp, .ico, .tif, .svg), audio or video file (e.g., mp3, mp4, webM, qt, mov, avi), document file (e.g., pdf, doc or its variant, xls or its variant, ppt or its variant, rtf, odf), gaming file, authentication file, or other types of file (e.g., parquet, zip, rar, exe, msi, cab, txt, swf, flv, psd, ai, eps, ps).

The ATUAL block 114 may update the tree 108 as the encoding is performed, and the ENVEL block 116 may perform aging on the encoded values. Using these blocks, the encoder 102 may generate a code 118 corresponding to the source file 110. In some embodiments, the code 118 is associated with a compressed version of the source file 110, and the code 118 is associated with a file smaller than the source file 110. In some embodiments, the code 118 is a .xml file that comprises 12 characters (e.g., 144 bits, 8 bits per character plus overhead). As described in more detail herein, along with the file tree, the code 118 may be used to rebuild the source file 110.

In some embodiments, the decoder 104 may comprise blocks that are similar to the various blocks in the encoder 102. For example, the INIC block 120 may be similar to the INIC block 106, and the ATUAL block 126 may be similar to the ATUAL block 114. The INIC block 120 may create and initialize the tree 108. The code 118 generated by the coding system may be received by the DECOD 124 block in the decoder 104. The ATUAL block 126 may update the tree 122 as the decoding is performed, and the ENVEL block 128 may perform aging on the decoded values. Using these blocks, the decoder 104 may generate a decoded output 130 corresponding to code 118. In some embodiments, the decoded output 130 is associated with an uncompressed file (e.g., the source file 110).

In some embodiments, the encoder 102 and/or the decoder 104 may be present at a decoding device. In some embodiments, the encoder 102 and/or the decoder 104 may be present at an encoding device. In some embodiments, the encoder 102 may be present at an encoding device, and the decoder 104 may be present at a different decoding device. The encoding or the decoding device may include, but are not limited to, personal computers, phones, laptops, tablets, servers, etc. The operations of the encoder 102 and the decoder 104 are described in more detail below.

The encoder 102 may use two types of platform files, for example, a master tree and a package. In some embodiments, a master tree may be a specially constructed Huffman tree (e.g., constructed with the methods described herein, tree 108), which may be used to advantageously encode and decode various types of source files (e.g., different media file formats, 40 different file types), and may be regularly updated to be compatible or more efficient with different or additional types of source files (e.g., using an artificial intelligence model, using machine learning, based on previous compressions of similar source files). The master tree may include all possible branches needed for these various types of source files.

For example, a master tree may be configured to encode or decode 40 different file types. If a master tree requires a new branch(es) to encode a file (e.g., a file associated with one of the 40 different file types, a file that is not associated with one of the 40 different file types), the system 100 may add and/or create new branch(es) to the master tree, allowing the file to be encoded. With the ability to add branches to a master tree, file types that are not included in the 40 file types can also be encoded or decoded with the master tree (e.g., a 400 MB master tree). In some embodiments, a new file type causes, on average, 10 MB of new branches to be added to the master tree, allowing a user to have the option of trading off between the optimal 400 MB master tree size (for 40 different file types) and ability to encode or decode additional file types.

In some embodiments, the master tree is included in a 400 MB .xml file that may be accessed by the system 100 (e.g., by an application associated with the components of the system 100). In some embodiments, a master tree file includes a portion representing the size of the original file, the coded tree, and an archive. The master tree may be stored and maintained at the encoder 102 (e.g., a storage of a device associated with the encoder 102) to create a package based on the source file 110 and at the decoder 104 (e.g., a storage of a device associated with the decoder 104) to decode the received package. Advantageously, storing the master tree at the encoder 102 and the decoder 104 may result in saving data processing time and data transmission time because the master tree may not need to be transmitted from the encoder 102 to the decoder 104. Branches of a tree (e.g., a master tree; a file tree, as described in more detail below) may be identified with branch nodes or branch IDs.

By using the system 100 for data compression (e.g., to compress source file 110), data storage efficiency (e.g., more files may be stored in a storage, a 1 TB hard drive may have an effective storage capacity of 200 TB) and/or data transfer efficiency (e.g., data transfer speeds may be improved, bandwidth may be increased, a 50 MB/sec bandwidth may be effectively increased to 1 TB/sec) may be improved. As a consequence of the increased efficiency, costs associated with storage and/or file transfer (e.g., cloud storage service, internet service) may be reduced, and quality of the content being stored or transferred may be improved (e.g., storage or transfer of a higher quality media file may be more feasible).

For example, the source file 110 may be a large file that may take up significant disk space or may take a long time to transfer. The system 100 allows the source file 110 to be encode into code 118, which may be a significantly smaller (e.g., up to 200 times smaller) file than the original file. The smaller file associated with code 118 may be stored or transfer in place of the large source file 110, improving storage efficiency and/or data transfer efficiency. When the source file 110 needs to be accessed, the system 100 may simply use the decoder 104 to decode the code 118 to generate the decode output 130, allowing access to the original source file 110 without sacrificing the original information and the source file 110 to be efficiently stored and transferred.

In some embodiments, access to the encoded file may be locked (e.g., by a user encoding the file) (e.g., to protect the file at a certain time). For example, in accordance with a determination that access to the encoded file is locked, scanning a bi-dimensional image (e.g., as described with respect to FIGS. 5A and 5B) will not decode the file, and in accordance with a determination that access to the encoded file is not locked, scanning the bi-dimensional image will decode the file. In some embodiments, the code is set to be opened a defined number of times (e.g., opened once, opened N number of times) or to be opened during a defined time.

In some embodiments, the encoder 102 may produce a package, which may include the code 118, after completing the encoding process. In some embodiments, the package includes a file tree reference and a code. A bi-dimensional image may be generated using the code from the package. In some embodiments, the package includes an encryption key. In some embodiments, the package includes a log file (e.g., for debugging). The package may be a .xml file. In some embodiments, the package does not include a bi-dimensional image, and the code is used to decode and rebuild the source file that a user intends to access. The log file may vary based on the encoding process and may be used for debugging issues related to encoding or administrative purposes. The log file may be a .xml file that is 100 bytes or bigger. In some embodiments, the package has a size that is from 1% to 2% of the size of the source file. In some embodiments, depending on the size of the source file, the package size may scale accordingly (e.g., a higher percentage for a smaller file, a lower percentage for a larger file).

In some embodiments, this package is stored until the uncompressed file associated with the package is accessed. For example, after encoding, the encoder 102 produces a package associated with the compressed file. In some examples, the package may be stored at a device that includes the encoder 102. In some examples, the package may be stored at a device (e.g., a cloud storage device) different from the device that includes the encoder 102.

In some embodiments, this package is then transmitted to the decoder 104 for rebuilding the source file (e.g., by decoding and generating the decoded output 130). In some embodiments, the package is stored until the source file needs to be accessed and the source is rebuilt (e.g., by decoding and generating the decoded output 130). The package may contain the components needed to sufficiently rebuild the source file at the decoder 104. These components may include but are not limited to a file tree, a file tree reference, an encryption key, a code, a bi-dimensional image, and a log file. In some embodiments, the following three components from the package are transferred to the decoder for rebuilding the source file (e.g., these three components sufficient allow the decoder to rebuild the source file)—the code or the bi-dimensional image, the file tree reference, and an encryption key. These three components may be transmitted via different transmissions or together to the decoder. In some embodiments, the encryption key may be transmitted independently (e.g., for security reasons).

In some embodiments, the file tree component of the package may be a tree created for a specific file during the encoding process (e.g., a tree created specifically for a particular media format for optimal data compression). The file tree may be created from a set of chosen branches in the master tree. For example, the file tree may include one to hundreds of branches (e.g., from the master tree). In some embodiments, the file tree is an .xml file that is approximately 1% of the size of the master tree.

Additionally, a list of the identifications of these chosen branches (e.g., from the master tree) may be stored in a file tree reference. In some embodiments, the file tree reference is used to rebuild (e.g., by the decoder 104, by referencing parts of the tree 108 needed to decode) the file tree while decoding. Using the file tree reference to rebuild the file tree may advantageously reduce a need to transfer the file tree to the decoder and reducing the size of the file being transferred or stored. In some embodiments, the file tree reference is of the file type 0.000. To create a file tree, segments of the master tree may be analyzed, and the smallest branch within the master tree that can represent a segment may be selected and its branch identification recorded. The branch identification may point to the beginning of the corresponding branch. The aggregate of the chosen branches may be stored in a file tree. Similarly, the aggregate of the identifications of the chosen branches may be stored in a file tree reference.

In some embodiments, one of the branch tree identifications (e.g., branch ID) may be selected as the encryption key. In some embodiments, the encryption key is a 256 bit .xml file. The encryption key may be a randomly generated number used to initialize a pseudo random number generator (e.g., by encoder 102), and the output of the generator may be used to encrypt the data being encoded. For example, the encryption key is used to encrypt the code 118, advantageously securing the file from unauthorized access.

In some embodiments, the transmitted package may be received by a decoding device, which may include the decoder 104. The decoder 104 may include the master tree, and an application may be associated with the decoder 104

(e.g., an application requesting access to the source file associated with the transmitted package). In some embodiments, the decoding device may receive the bi-dimensional image associated with the code (described in more detail herein) as part of the transmitted package and then extract the code from it. In some embodiments, the decoding device may read a bi-dimensional image displayed on an object (e.g., printed on a physical object, paper, glass, film, a printable surface, advertisement, mug, business card, shown in a display), and a camera (e.g., of the decoding device) is used to extract the code. From the code, the decoding device may then use the received file tree reference, the stored master tree, and the received encryption key to rebuild the source file from the code (e.g., code 118).

In some embodiments, after receiving the bi-dimensional image (e.g., by capturing or scanning the bi-dimensional image on the decoding device), the decoding device may require a seed file to extract the code (e.g., code 118) from the bi-dimensional image. During encoding, the seed may be utilized to generate a pseudo random number(s) based on the source file (e.g., a stream of integers). During decoding, using the pseudo random number generator, the same seed may be used to recover the source file. For example, when the seed, a range of values in the source file, and the size of the source file are known (e.g., size of array of integers), the source file may be recovered from the pseudo random number. Each seed may be associated with to a code or a bi-dimensional image (e.g., the seed is the code's unique identifier). For this reason, the seed may be used to recover the source file.

Although the system 100 is described with the illustrated components, it is understood that the illustrations are merely exemplary. It is understood that the system 100 may include additional or fewer components than illustrated or that components of system 100 may be included in different devices or systems. For example, a system 100 may include some, but not all, of the illustrated components. As an example, a first system 100 (e.g., of a first device) may include the encoder 102, and a second system 100 (e.g., of a second device) may include the decoder 104. As another example, some components of the encoder 102 or the decoder 104 may be included in a first device (e.g., a transmitting device, a receiving device, a storage device), and some components of the encoder 102 or the decoder 104 maybe included in a second device (e.g., a server, a cloud storage device). As yet another example, the decoder 104 may perform error correction or detection to improve encoding and/or decoding accuracy (e.g., to correct for defects (e.g., color and spatial inconsistencies compared to an intended bi-dimensional image) associated with a printed image of the bi-dimensional image).

Figure 2:
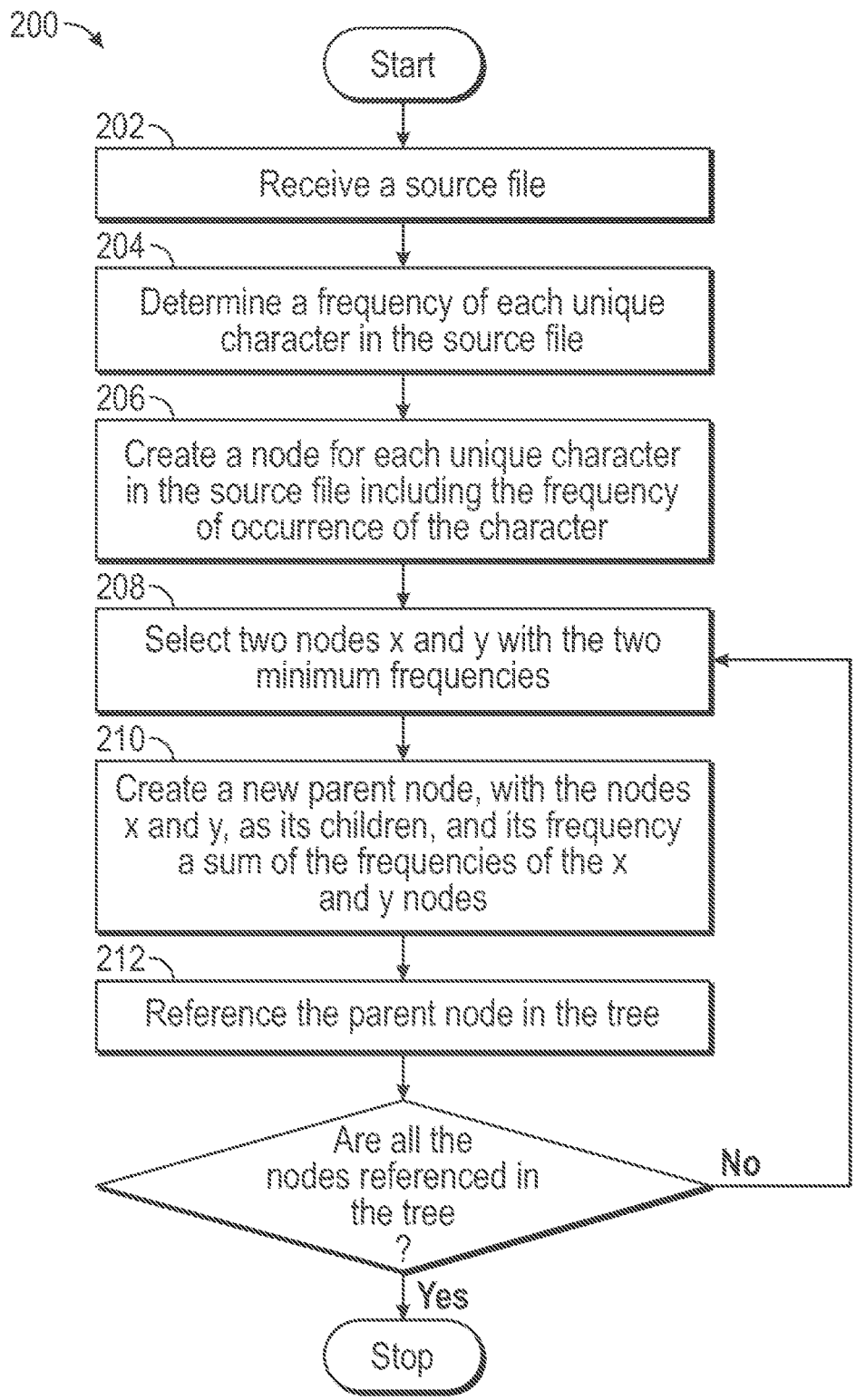
FIG. 2 illustrates an exemplary process for constructing a master tree, according to embodiments of the disclosure.

In some embodiments, the master tree may be constructed using a process 200 illustrated in FIG. 2. In some embodiments, the process 200 is a method of operating the system 100. Although the process 200 is illustrated as including the described steps, it is understood that different order of steps, additional steps, or less steps may be performed to operate an exemplary data compression system without departing from the scope of the disclosure. In some embodiments, the process 200 generates a master tree used to generate the tree 108. In some embodiments, the process 200 generates the tree 108.

At step 202, a source file to be encoded is received. For example, the encoder 102 receives the source file 110. At step 204, a frequency of occurrence for each unique character in the source file is determined. For example, the encoder 102 determines a frequency of occurrence for each unique character in the source file 110.

At step 206, a node for each character is created. The node may include the frequency of occurrence for the character in the source file. For example, a node for each unique character having a corresponding frequency of occurrence in the source file 110 is created. At step 208, two nodes, x and y, with two minimum frequencies are chosen. For example, out of all the frequencies of occurrences for each unique character in the source file 110, two nodes (e.g., x and y) corresponding to the two lowest frequencies are chosen (e.g., by the encoder 102).

At step 210, a new parent node is created. The parent node has nodes x and y as its children and has a frequency that is a sum of the frequencies of the x and y nodes (e.g., selected from step 208). At step 212, the parent node is referenced in the tree. Steps 208 to 210 are repeated until all the nodes are referenced in a single tree (e.g., the data is no longer sets of mutually disjoint trees). In some embodiments, the process 200 includes analyzing the sequence of bytes of the source file (e.g., the internal structure), in addition to the format of the source file.

By accounting for the frequencies of characters in the tree, probability of occurrence of a symbol (e.g., in a source file) may be known in advance. Using such a tree for encoding, the source file may be more optimally compressed, and a code (e.g., code 118) may be generated with less redundancy.

FIGS. 3A-3B illustrate exemplary pseudocode to perform the encoding and decoding processes described herein. In some embodiments, before encoding the block of bits, all variables are initialized, and the bits associated with the block of bits are allocated or stored in storage. Then, calculations are made for differences of each bit for possible combinations of internal references that can be applied to the block of bits. The combination of references that offers the lowest value of the sum of the mean square errors for each of the bits would be the determined block of bits.

FIG. 3A depicts a pseudocode 302 to determine a block of bits from an exemplary source file. As illustrated, "1's" are ingressed to a current bit of the block of bits until the size of the block of bits reaches a "high" value. When the size of the block of bits reaches a "high" value, the current bit is replaced by "0."

FIG. 3B depicts a pseudocode 304 to encode an exemplary block of bits. In some embodiments, the decoding process is implemented by inverting the steps described in the encoding process.

In some embodiments, a source file may be divided into a number of strings, and the encoding described herein may be repeatedly performed on these strings to advantageously achieve higher compression. An example of this process is illustrated in FIGS. 4A-4I.

Figures 4A, 4B:
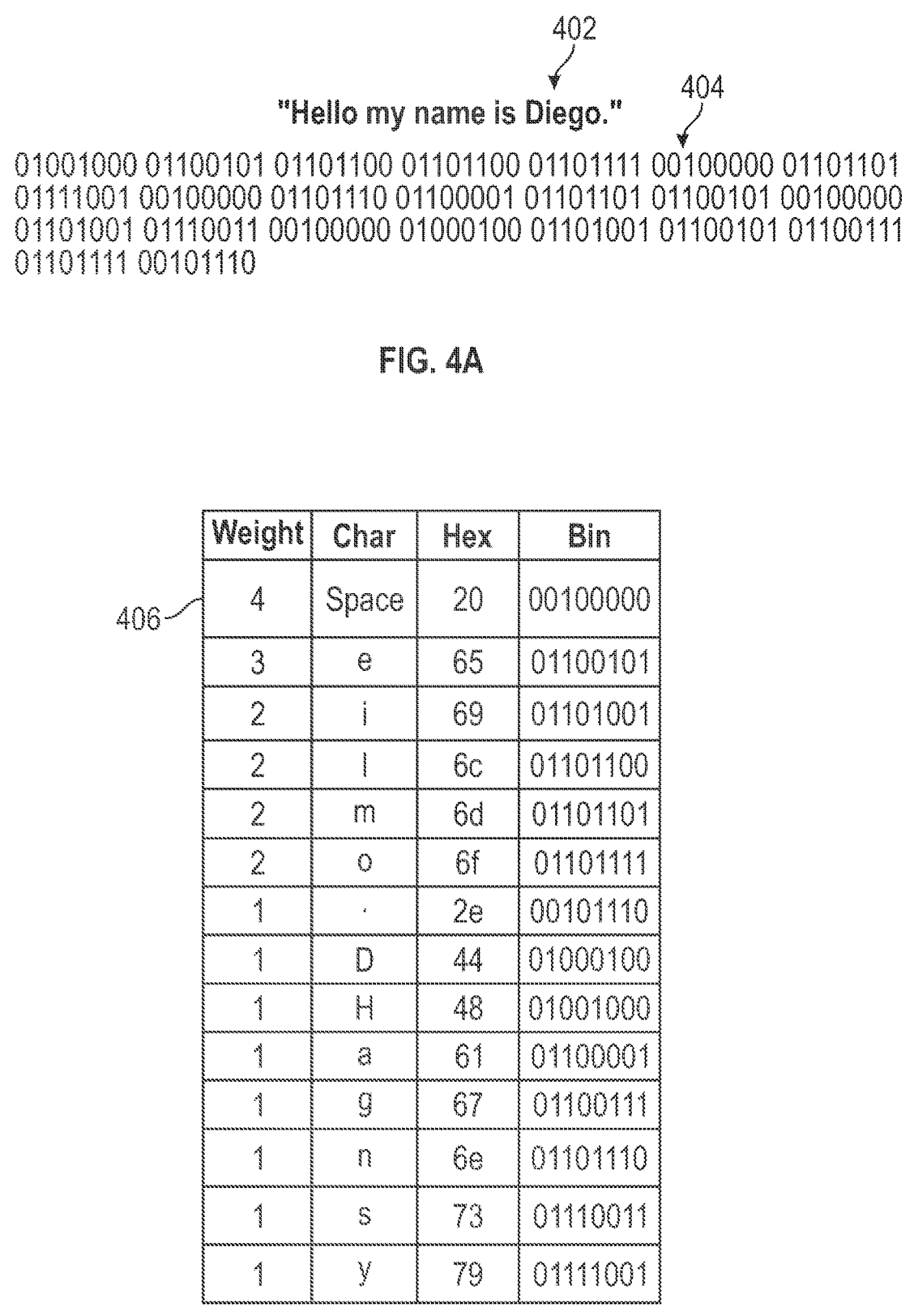

As shown in FIG. 4A, a source string 402 (e.g., representative of source file 110) may be received (e.g., by encoder 102) and converted into its equivalent ASCII character source binary string 404. As shown in FIG. 4B, a first weight table 406 may be created. The first weight table 406 is a set of unique characters in the source string 402 ordered by their respective frequencies of occurrence in the source binary string 404 (e.g., from performing step 204). In the first weight table 406, the "Char" column represents the different ASCII characters. Additionally, the "Hex" and "Bin" columns represent the hexadecimal and binary forms respectively of the different ASCII characters. The "Weight" column represents frequencies of the unique characters of the source string 402. For example, the "e" character occurred 3 times in the source string 402.

Figure 4C:
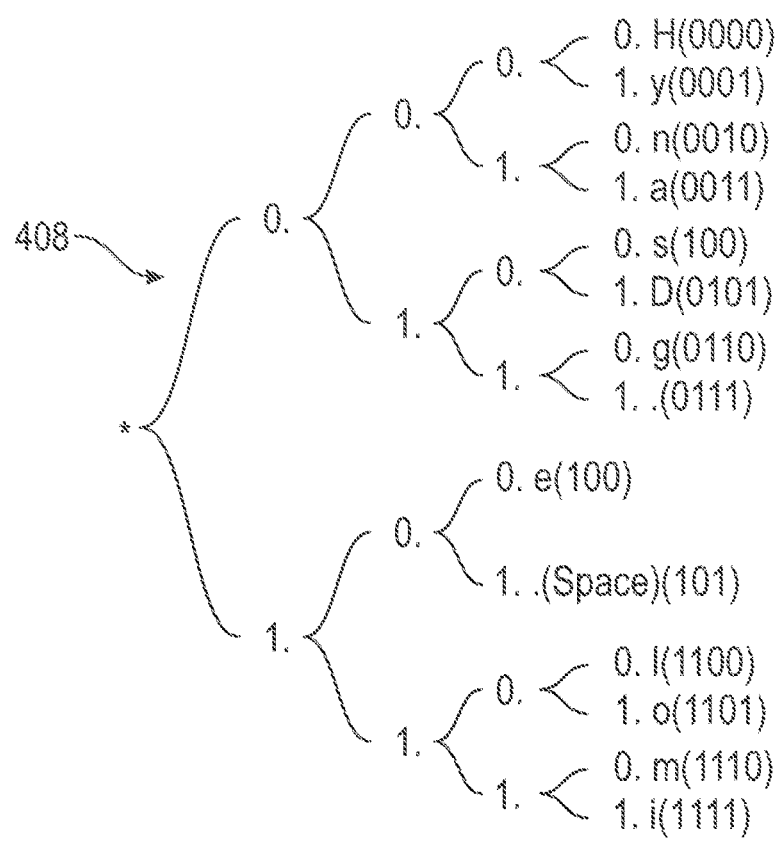

As shown in FIG. 4C, a first Huffman tree 408 may be built based on the first weight table 406 using the process 200 described with respect to FIG. 2. For example, using the process 200, based on the frequencies of the characters in the source string 402, the first Huffman tree 408 is generated.

As shown in FIG. 4D, a short code for each ASCII character in the source string may be determined using the first Huffman tree 408. The first weight table 406 may then be updated with the short code for each ASCII character, as indicated by the "Short Code" column. As shown in FIG. 4E, the source binary string 404 may be encoded using the short codes in the first weight table 406 to generate the first encoded string 410. For example, the first encoded string 410 is constructed based on the source string 402 by mapping the short code values of each character to the source string 402. The first encoded string 410 may have advantageously reduced 50% in size, compared to the source binary string 404.

As shown in FIG. 4F, the first encoded string 410 may be padded with zeroes (e.g., the last portion of the first encoded string 410 is padded with zeroes), such that the total number of bits in the first encoded string 410 is a multiple of eight. Alternatively, the first encoded string 410 may be padded with non-zero values (e.g., ones) such that the total number of bits in the first encoded string is a multiple of eight.

Additionally, the first encoded string 410 may be divided into sets of eight bits 412. As shown in FIG. 4G, different ASCII character values (e.g., place holder characters), for example A-K, may be assigned to each eight bit set 412, and a second weight table 414 including the frequency of each eight bit set 412 may be created. It is understood that other ASCII character values may be assigned to each eight bit set 412.

Figures 4H, 4I:
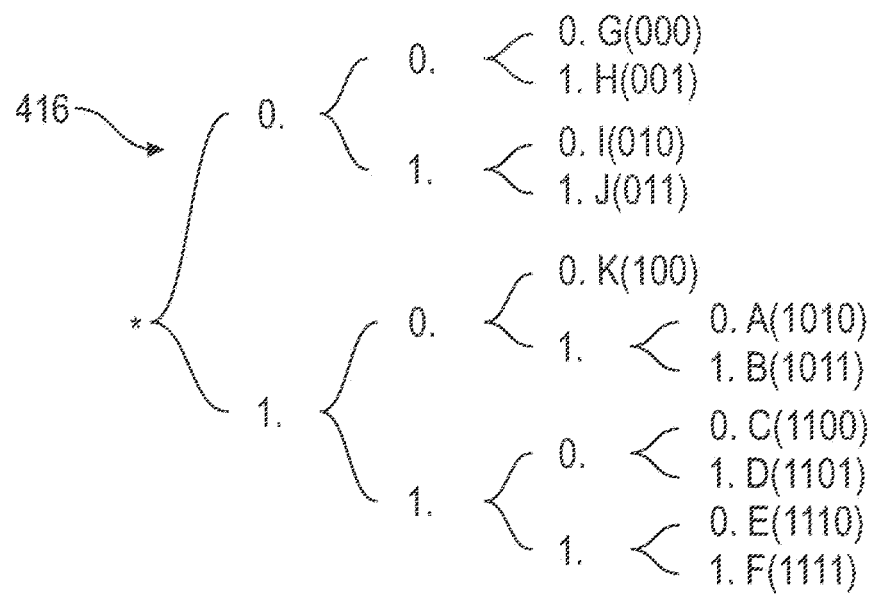

As shown in FIG. 4H, a second Huffman tree 416 may be built based on the second weight table 414 using the process 200 described with respect to FIG. 2. The second Huffman tree 416 and may be used to determine the short codes for ASCII characters A-K.

As shown in FIG. 4I, the first encoded string 410 may be further encoded using the short codes determined from the second Huffman tree 416 to generate a second encoded string 418. The second encoded string 416 may have advantageously reduced 50% in size, compared to the first encoded string 410. That is, compared to the source binary string 404, the second encoded string 416 may have advantageously reduced to 25% in size or less. In some embodiments, the recursive Huffman technique can be performed in more than one direction (e.g., up a tree, down a tree).

Although FIGS. 4A-4I describe compressing the source binary string 404 by encoding the binary string twice, it is understood that the described encoding is merely exemplary. For example, the second encoded string 410 may be compressed again using the steps described above to produce a third encoded string, and the compression may be repeated until a desired compression is reached (e.g., until a 12 character code is created) or further encoding may not be possible.

In order to decode the encoded string to obtain the original string, all the Huffman trees that have been used for encoding will be used for decoding. For example, the second encoded string 410 may be decoded with the Huffman trees described with respect to FIGS. 4C and 4H. Although FIGS. 4A-4I describe data sets of eight bits, it is understood that the eight-bit datasets are exemplary. Other bits of datasets may be used for encoding. For example, 16, 32, or 64-bit sets may be used for creating the Huffman trees.

Figure 5B:
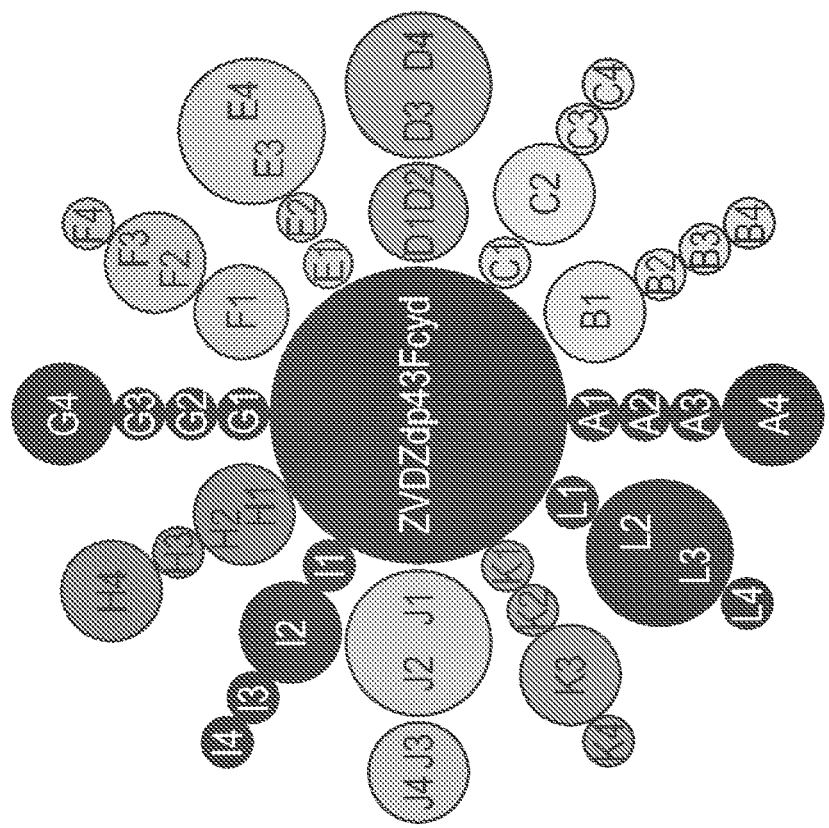
FIGS. 5A-5B illustrate exemplary bi-dimensional images, according to embodiments of the disclosure.
Figure 5A:
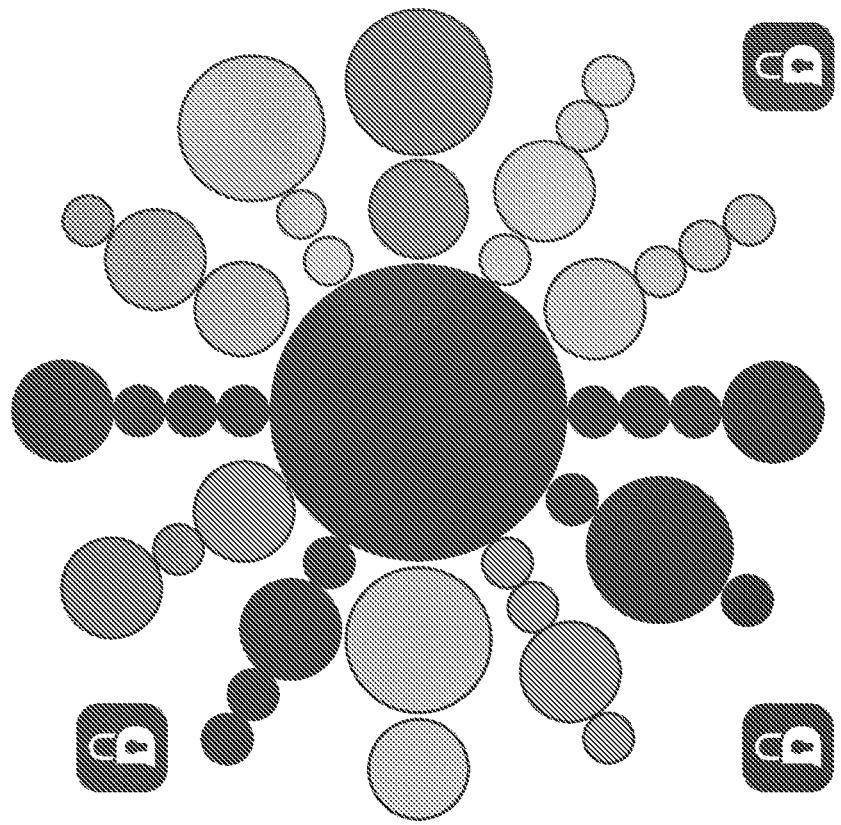

In some embodiments, an encoded string (e.g., a twelve-character code) may be transformed into a bi-dimensional image, as shown in FIGS. 5A-5B. For example, the bi-dimensional image shown in FIG. 5A is a representative of a code (e.g., code 118) that is transformed into a visual element, and the bi-dimensional image show in FIG. 5B is representative of a stream that is transformed into a visual element.

In some embodiments, the bi-dimensional image corresponds to the code 118, which may be associated with a compressed version of the source file (e.g., source string 110). Elements of the bi-dimensional image may be readable by a sensing device such as a camera, an optical sensor configured to detect visual wavelengths, or a sensor configured to detect non-visual wavelengths. The bi-dimensional image includes information represented by visual properties, as described herein, along different directions or axes of the image. The bi-dimensional image may include circles. In some examples, the circles may be in one of three RGB colors (e.g., in an RGB color space), in four different sizes. For example, each of the cells of the bi-dimensional image may represent a part of the code 118 (e.g., the characteristics or features of a cell represents bit values of "0" and "1"). Absence of a color may represent a minimum value associated with a cell (e.g., a circle), and a maximum value of a color may represent a maximum value associated with the cell. Different sizes and positions of the cells may also represent different data values associated with the cell.

Nine different circles may be included in the bi-dimensional image along an axis through these nine circles (e.g., an axis through the center of the center circle). In some embodiments, the bi-dimensional image is a 350 KB .pdf file, or another suitable file representation, which may be significantly smaller than the size of the source file. With these different variables (e.g., colors, positions, quantity, geometries) and the generation of a more efficient code (e.g., code 118) representing the source file, the bi-dimensional image can advantageously accurately encode a large file that may otherwise be compressed into a larger file or a less accurate file.

Although the bi-dimensional image is described as illustrated and as having particular configurations, it is understood that the descriptions of the bi-dimensional image are merely exemplary and that different arrangements and configurations of the bi-dimensional image may exist. For example, the bi-dimensional image may include other shapes (e.g., triangles, quadrilaterals, polygons) or geometries. As another example, the circles may be in colors other than the three RGB colors. As yet another example, a circle may include more than one color or additional information (e.g., text, additional geometries). As yet another example, the circles may be in less than or more than four different sizes. As yet another example, there may be less than or more than nine different circles along an axis of the bi-dimensional image. The bi-dimensional image may include less elements to represent a smaller file. The bi-dimensional image may include more elements to represent a larger file.

The bi-dimensional image may advantageously allow a user to share a file (e.g., a large file that may require a long transfer time) by simply sharing the bi-dimensional image for a receiver to decode, using the methods described herein, reducing a time for the received to access the shared file. As explained above, in some embodiments, the encoded string or the bi-dimensional image may be transferred as part of a package to a decoding device.

Figure 6B:
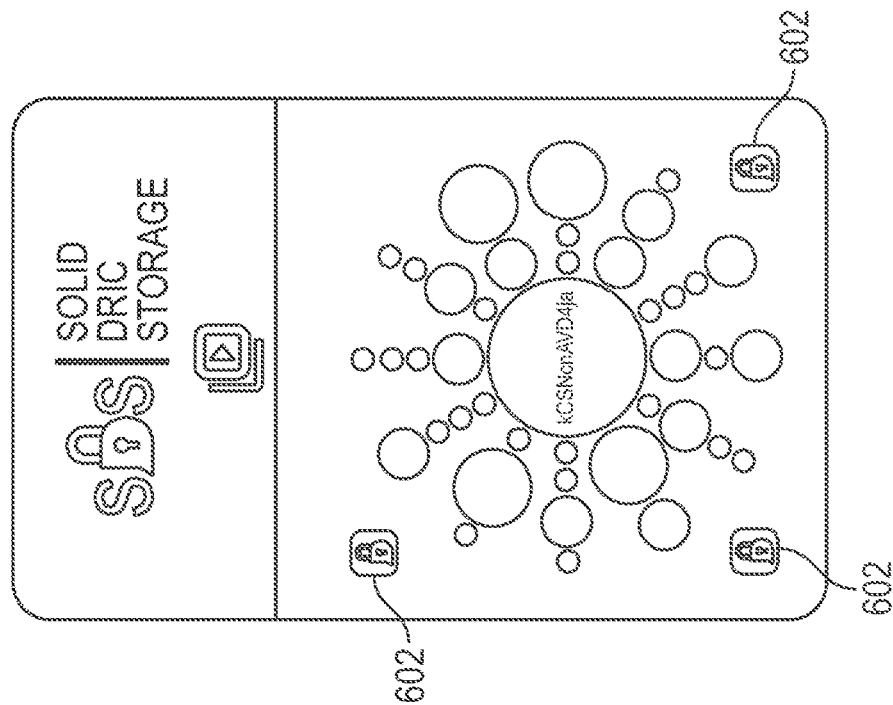
FIGS. 6A-6B illustrate exemplary bi-dimensional images, according to embodiments of the disclosure.
Figure 6A:
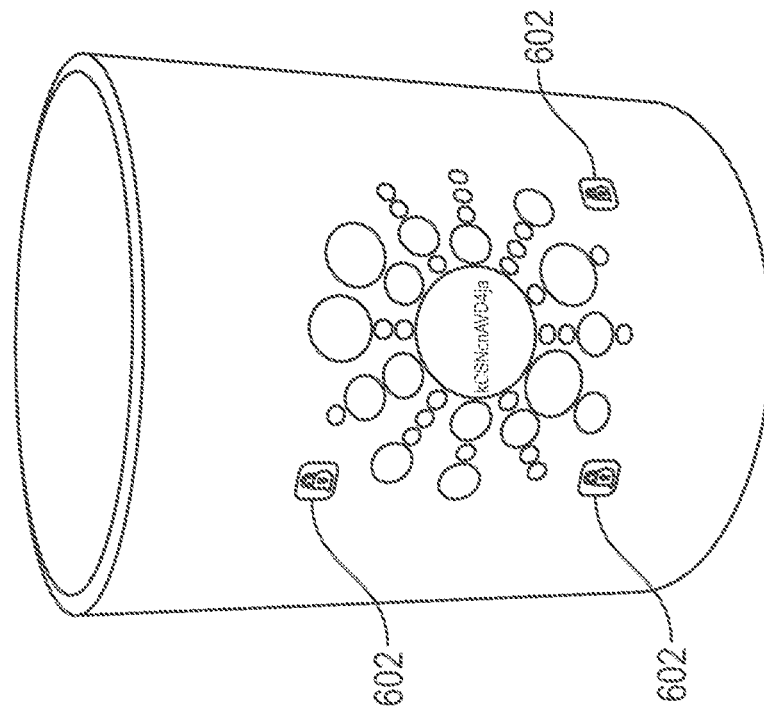

In some embodiments, as illustrated in FIGS. 6A-6B, the bi-dimensional image may be printed on a physical object and may be read by a camera of the decoding device. In some embodiments, one or more locks 602 may be present in the bi-dimensional image. The locks 602 may be used to for a variety of purposes including, but not limited to, advantageously focusing the camera of the decoding device on the bi-dimensional image, aligning the camera of the decoding device correctly with the bi-dimensional image, validating a bi-dimensional image for authenticity, identifying the bi-dimensional image as a valid image, differentiating levels of access to the decoded file (e.g., pay to access vs. free content), etc. For example, the camera may keep sensing for the bi-dimensional image until the locks are located at specific locations of the frame. As another example, a decoding device may include a graphical user interface that includes visual guides that can help a user align the locks to the camera. As yet another example, along with the locks 602, object recognition and/or artificial intelligence algorithm may be used to more efficiently detect the bi-dimensional image. By including the one or more locks 602 to better align the decoding device's camera to the bi-dimensional image, the camera may focus onto the bi-dimensional image quicker, and with these reference points, the bi-dimensional image may be decoded more accurately (e.g., locations of portions of the bi-dimensional image may less likely be misidentified).

In some embodiments, the bi-dimensional image may be built from an encoded string using the example code table 702 in FIG. 7. The code table 702 maps features of the bi-dimensional image to a value corresponding to a code (e.g., code 118) associated with the bi-dimensional image, for recovery of the code.

Figure 8:
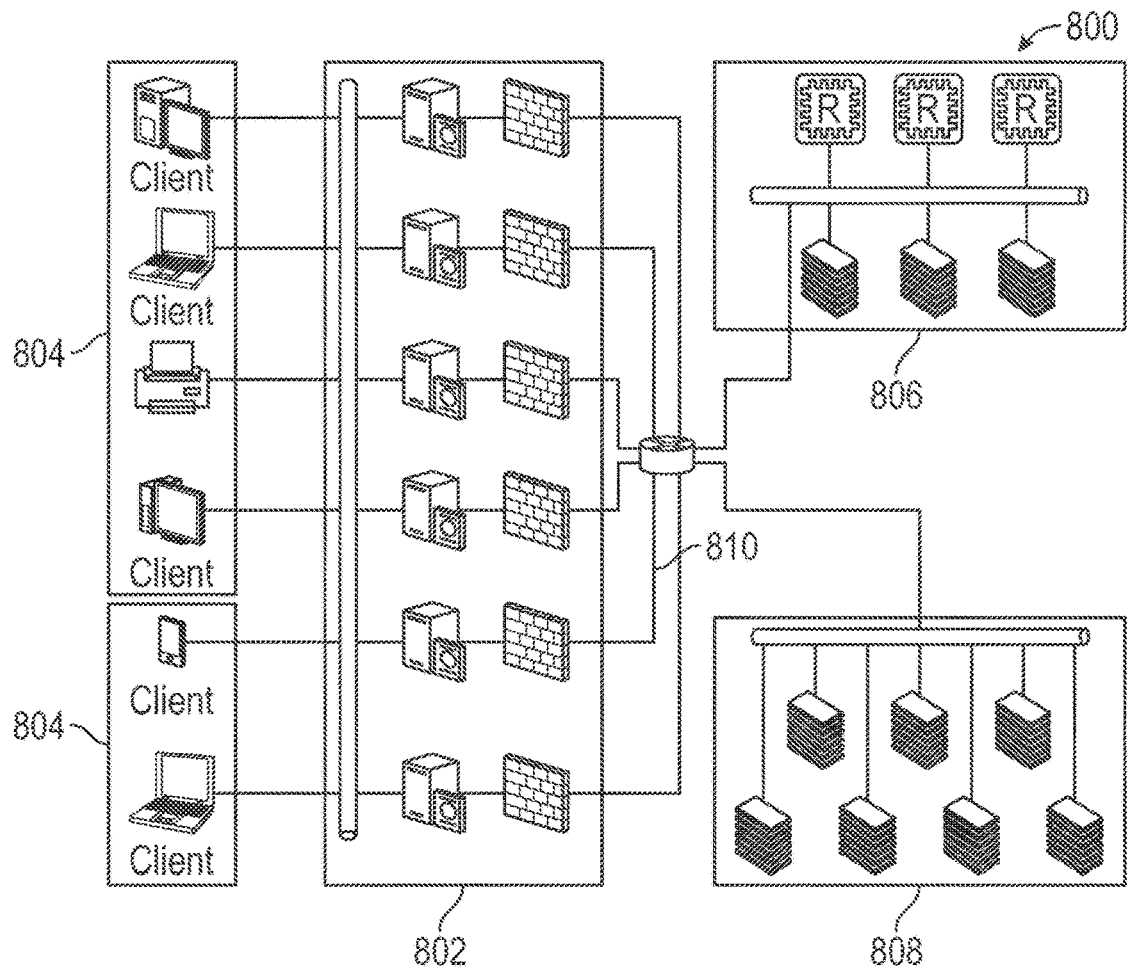
FIG. 8 illustrates an exemplary service bus architecture, according to embodiments of the disclosure.

FIG. 8 illustrates a service bus architecture of an exemplary file compression system, according to embodiments of the disclosure. Components of the service bus architecture may belong to different systems and may be coupled to each other via wired or wireless connections. The system 800 includes a service bus 810, which enables data to be transferred among an interface server farm 802, consumer devices 804, a seeds tier 806, a decoder (e.g., decoder 104) and encoder (e.g., encoder 102) server farm 808 and external systems (not shown). The service bus 810 and its connection to the different components of the system 800 may be implemented using a wired or a wireless connection; additional components associated with these connections may not be shown. The interface server farm 802 may enable consumer devices 804 to send data to be encoded (e.g., source string 110 to be encoded, a file to be compressed) or decoded (e.g., a code 118 to be decoded, a compressed filed to be decompressed) to the encoder and decoder server farm 808. The decoder and encoder server farm 808 may host the decoders and encoders configured to perform the above described decoding and encoding processes. The seeds tier 806 may store various files used for encoding and decoding. These files may include, but are not limited to, seeds, master trees, packages, etc. Additionally, the system 800 may be expandable by coupling to external systems using the service bus 810.

Although the system 800 is described with the illustrated components, it is understood that the illustrations are merely exemplary. It is understood that the system 800 may include additional or fewer components than illustrated or components of system 800 may be included in different devices or systems. For example, there may be different types and/or different number of consumer devices 804. As another example, one or more of the interface service farm 802, seeds tier 806, and decoder and encoder server farm 808 may be formed by more than one sub-components. As yet another example, aspects of one or more of the interface service farm 802, seeds tier 806, and decoder and encoder server farm 808 may be combined and performed with one component.

Figure 9:
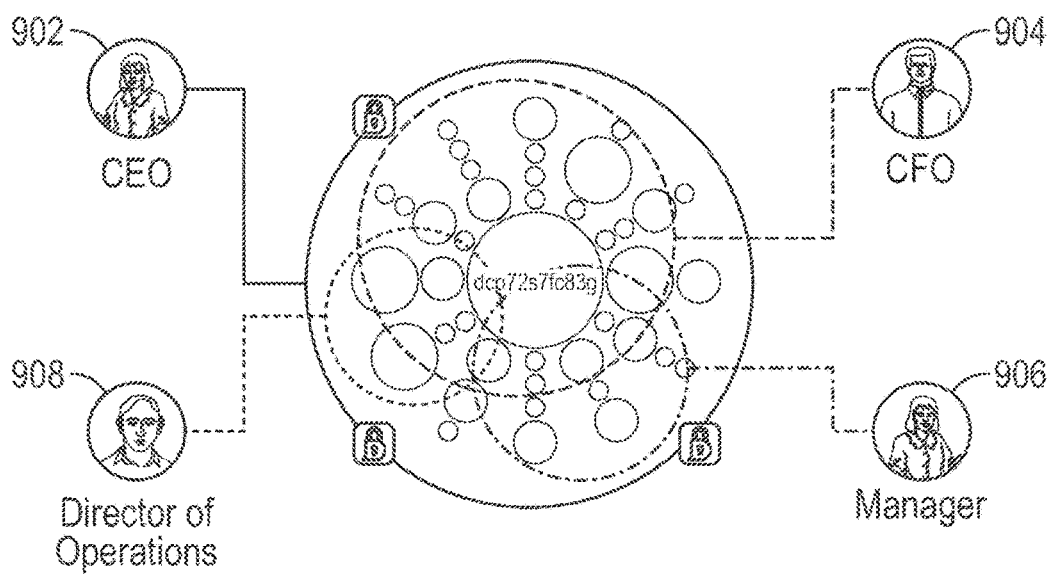
FIG. 9 illustrates exemplary data access levels in an organization, according to embodiments of the disclosure.

FIG. 9 illustrates exemplary data access levels in an organization, according to embodiments of the disclosure. In some embodiments, the system may enable an organization to define data access levels for different people in the organization. For example, the CEO 902 of the organization may be able to access all the data (e.g., all of the decoded data associated with a bi-dimensional image), whereas other organization members like the CFO 904, manager 906, and director of operations 908 may each have access to only a certain subset of data (e.g., a subset of decoded data associated with the bi-dimensional image).

As an example, a bi-dimensional image may be associated with more than one file (e.g., more than one file are encoded into a bi-dimensional image). The CEO 902 may be able to access all of the files encoded in the bi-dimensional image, and the CFO 904, manager 906, and director of operations 908 may have partial access to the files encoded in the bi-dimensional image (e.g., two out of four files).

Although data access levels of an encoded file in an organization is described with the illustrated components and elements, it is understood that the illustrations are merely exemplary. It is understood that the data access levels of an encoded file may include additional or fewer components or elements than illustrated or different components or elements may be included. For example, the organization may be a family and not a business; the parents of a family may have full access of the decoded data, while the children of the family may have access to a subset of the decoded data.

Methods for accessing files are disclosed. In some examples, a method may comprise: receiving a source string to be compressed, the source string comprising a plurality of characters; determining a first frequency for each character of the plurality of characters of the source string; determining a first tree corresponding to the source string based on the first frequencies; encoding the source string using the first tree to generate a first encoded string; determining whether a total number of bits in the first encoded string is a multiple of eight; in accordance with a determination that the total number of bits in the first encoded string is not a multiple of eight, appending the first encoded string with zeroes so that a new total number of bits in the first encoded string is a multiple of eight; in accordance with a determination that the total number of bits in the first encoded string is a multiple of eight, forgoing appending the first encoded string with zeroes; dividing the first encoded string into one or more eight-bit segments and assigning a placeholder character to each eight-bit segment; determining a second frequency for each of the placeholder characters in the first encoded string; determining a second tree corresponding to the first encoded string based on the second frequencies; and encoding the first encoded string using the second tree to generate a second encoded string. In some examples, the method further comprises storing a first weight table comprising the first frequency for each character in the plurality of characters in the source string. In some examples, the method further comprises storing a second weight table comprising the second frequency for each of the placeholder characters in the first encoded string. In some examples, the source string is associated with a file. In some examples, the method further comprises determining a bi-dimensional image based on the second encoded string. In some examples, the bi-dimensional image comprises a colored image. In some examples, the method further comprises: transmitting the bi-dimensional image; extracting the second encoded string from the bi-dimensional image; and decoding the second encoded string using the first tree and second tree to rebuild the source string. In some examples, the bi-dimensional image includes visual properties that include information associated with the second encoded string. In some examples, the method further comprises: detecting the bi-dimensional image; extracting the second encoded string from the bi-dimensional image; and decoding the second encoded string using the first tree and second tree to rebuild the source string. In some examples, the method further comprises storing the bi-dimensional image in a memory. In some examples, determining the first tree corresponding to the source string comprises: creating a plurality of first tree nodes corresponding to the plurality of characters in the source string, wherein each first tree node includes the first frequency for a corresponding character; determining a first child node having a first minimum first frequency and a second child node having a second minimum first frequency from the plurality of first tree nodes; combining the first child node and the second child node to create a parent node, wherein a frequency for the parent node is a sum of the first minimum first frequency and the second minimum first frequency; referencing the parent node in the first tree; and repeating the steps of determining the first child node and the second child node, combining the first child node and the second child node, and referencing the parent node until each one of the plurality of first tree nodes is referenced in the first tree. In some examples, determining the second tree corresponding to the first encoded string comprises: creating a plurality of second tree nodes corresponding to the placeholder characters in the first encoded string, wherein each second tree node includes the second frequency for a corresponding placeholder character; determining a first child node having a first minimum second frequency and a second child node having a second minimum second frequency from the plurality of second tree nodes; combining the first child node and the second child node to create a parent node, wherein a frequency for the parent node is a sum of the first minimum second frequency and the second minimum second frequency; referencing the parent node in the second tree; and repeating the steps of determining the first child node and the second child node, combining the first child node and the second child node, and referencing the parent node until each one of the plurality of second tree nodes is referenced in the second tree. In some examples, the first tree comprises a Huffman tree, and the second tree comprises a Huffman tree. In some examples, the second encoded string is smaller than the source string. In some examples, the method further comprises: receiving a second source string; and encoding the second source string using at least one of the first tree and the second tree. In some examples, the method further comprises storing the second encoded string.

Systems are disclosed. In some examples, a system may comprise: a communications interface; a memory; and one or more processors configured to perform a method comprising: receiving, via the communications interface, a source string to be compressed, the source string comprising a plurality of characters; determining a first frequency for each character of the plurality of characters of the source string; determining a first tree corresponding to the source string based on the first frequencies; encoding the source string using the first tree to generate a first encoded string; determining whether a total number of bits in the first encoded string is a multiple of eight; in accordance with a determination that the total number of bits in the first encoded string is not a multiple of eight, appending the first encoded string with zeroes so that a new total number of bits in the first encoded string is a multiple of eight; in accordance with a determination that the total number of bits in the first encoded string is a multiple of eight, forgoing appending the first encoded string with zeroes; dividing the first encoded string into one or more eight-bit segments and assigning a placeholder character to each eight-bit segment; determining a second frequency for each of the placeholder characters in the first encoded string; determining a second tree corresponding to the first encoded string based on the second frequencies; and encoding the first encoded string using the second tree to generate a second encoded string. In some examples, the method further comprises storing, in the memory, a first weight table comprising the first frequency for each character in the plurality of characters in the source string. In some examples, the method further comprises storing, in the memory, a second weight table comprising the second frequency for each of the placeholder characters in the first encoded string. In some examples, the source string is associated with a file. In some examples, the method further comprises determining a bi-dimensional image based on the second encoded string. In some examples, the bi-dimensional image comprises a colored image. In some examples, the method further comprises: transmitting, via the communications interface, the bi-dimensional image; extracting the second encoded string from the bi-dimensional image; and decoding the second encoded string using the first tree and second tree to rebuild the source string. In some examples, the bi-dimensional image includes visual properties that include information associated with the second encoded string. In some examples, the method further comprises: detecting, via one or more sensors of the system, the bi-dimensional image; extracting the second encoded string from the bi-dimensional image; and decoding the second encoded string using the first tree and second tree to rebuild the source string. In some examples, the method further comprises storing the bi-dimensional image in the memory. In some examples, determining the first tree corresponding to the source string comprises: creating a plurality of first tree nodes corresponding to the plurality of characters in the source string, wherein each first tree node includes the first frequency for a corresponding character; determining a first child node having a first minimum first frequency and a second child node having a second minimum first frequency from the plurality of first tree nodes; combining the first child node and the second child node to create a parent node, wherein a frequency for the parent node is a sum of the first minimum first frequency and the second minimum first frequency; referencing the parent node in the first tree; and repeating the steps of determining the first child node and the second child node, combining the first child node and the second child node, and referencing the parent node until each one of the plurality of first tree nodes is referenced in the first tree. In some examples, determining the second tree corresponding to the first encoded string comprises: creating a plurality of second tree nodes corresponding to the placeholder characters in the first encoded string, wherein each second tree node includes the second frequency for a corresponding placeholder character; determining a first child node having a first minimum second frequency and a second child node having a second minimum second frequency from the plurality of second tree nodes; combining the first child node and the second child node to create a parent node, wherein a frequency for the parent node is a sum of the first minimum second frequency and the second minimum second frequency; referencing the parent node in the second tree; and repeating the steps of determining the first child node and the second child node, combining the first child node and the second child node, and referencing the parent node until each one of the plurality of second tree nodes is referenced in the second tree. In some examples, the first tree comprises a Huffman tree, and the second tree comprises a Huffman tree. In some examples, the second encoded string is smaller than the source string. In some examples, the method further comprises: receiving, via the communications interface, a second source string; and encoding the second source string using at least one of the first tree and the second tree. In some examples, the method further comprises storing, in the memory, the second encoded string.

Non-transitory computer readable mediums are disclosed. In some examples, a computer readable medium may include instructions that, when executed by one or more processors, cause the one or more processors to perform a method comprising: receiving, via a communications interface, a source string to be compressed, the source string comprising a plurality of characters; determining a first frequency for each character of the plurality of characters of the source string; determining a first tree corresponding to the source string based on the first frequencies; encoding the source string using the first tree to generate a first encoded string; determining whether a total number of bits in the first encoded string is a multiple of eight; in accordance with a determination that the total number of bits in the first encoded string is not a multiple of eight, appending the first encoded string with zeroes so that a new total number of bits in the first encoded string is a multiple of eight; in accordance with a determination that the total number of bits in the first encoded string is a multiple of eight, forgoing appending the first encoded string with zeroes; dividing the first encoded string into one or more eight-bit segments and assigning a placeholder character to each eight-bit segment; determining a second frequency for each of the placeholder characters in the first encoded string; determining a second tree corresponding to the first encoded string based on the second frequencies; and encoding the first encoded string using the second tree to generate a second encoded string. In some examples, the method further comprises storing, in a memory, a first weight table comprising the first frequency for each character in the plurality of characters in the source string. In some examples, the method further comprises storing, in a memory, a second weight table comprising the second frequency for each of the placeholder characters in the first encoded string. In some examples, the source string is associated with a file. In some examples, the method further comprises determining a bi-dimensional image based on the second encoded string. In some examples, the bi-dimensional image comprises a colored image. In some examples, the method further comprises: transmitting, via a communications interface, the bi-dimensional image; extracting the second encoded string from the bi-dimensional image; and decoding the second encoded string using the first tree and second tree to rebuild the source string. In some examples, the bi-dimensional image includes visual properties that include information associated with the second encoded string. In some examples, the method further comprises: detecting, via one or more sensors, the bi-dimensional image; extracting the second encoded string from the bi-dimensional image; and decoding the second encoded string using the first tree and second tree to rebuild the source string. In some examples, the method further comprises storing the bi-dimensional image in a memory. In some examples, determining the first tree corresponding to the source string comprises: creating a plurality of first tree nodes corresponding to the plurality of characters in the source string, wherein each first tree node includes the first frequency for a corresponding character; determining a first child node having a first minimum first frequency and a second child node having a second minimum first frequency from the plurality of first tree nodes; combining the first child node and the second child node to create a parent node, wherein a frequency for the parent node is a sum of the first minimum first frequency and the second minimum first frequency; referencing the parent node in the first tree; and repeating the steps of determining the first child node and the second child node, combining the first child node and the second child node, and referencing the parent node until each one of the plurality of first tree nodes is referenced in the first tree. In some examples, determining the second tree corresponding to the first encoded string comprises: creating a plurality of second tree nodes corresponding to the placeholder characters in the first encoded string, wherein each second tree node includes the second frequency for a corresponding placeholder character; determining a first child node having a first minimum second frequency and a second child node having a second minimum second frequency from the plurality of second tree nodes; combining the first child node and the second child node to create a parent node, wherein a frequency for the parent node is a sum of the first minimum second frequency and the second minimum second frequency; referencing the parent node in the second tree; and repeating the steps of determining the first child node and the second child node, combining the first child node and the second child node, and referencing the parent node until each one of the plurality of second tree nodes is referenced in the second tree. In some examples, the first tree comprises a Huffman tree, and the second tree comprises a Huffman tree. In some examples, the second encoded string is smaller than the source string. In some examples, the method further comprises: receiving, via a communications interface, a second source string; and encoding the second source string using at least one of the first tree and the second tree. In some examples, the method further comprises storing, in a memory, the second encoded string.

Although examples of this disclosure have been fully described with reference to the accompanying drawings, it is to be noted that various changes and modifications will become apparent to those skilled in the art. Such changes and modifications are to be understood as being included within the scope of examples of this disclosure as defined by the appended claims.

The invention claimed is:
1. A method comprising:
receiving a source file comprising a plurality of characters;
determining a respective first frequency for each character of the plurality of characters of the source file;
determining a first tree corresponding to the source file based on the respective first frequencies;
encoding the source file using the first tree to generate a first encoded file;
in accordance with a determination that the total number of bits in the first encoded file is not a multiple of a first segment length, appending the first encoded file with one or more bits so that a new total number of bits in the first encoded file is a multiple of the first segment length;

in accordance with a determination that the total number of bits in the first encoded file is a multiple of the first segment length, forgoing appending the first encoded file with one or more bits;
dividing the first encoded file into one or more segments, each segment having the first segment length;
assigning a placeholder value to each of the one or more segments;
determining a respective second frequency for each of the placeholder values in the first encoded file;
determining, based on the respective second frequencies, a second tree corresponding to the first encoded file;
encoding the first encoded file using the second tree to generate a second encoded file; and
generating a package comprising: a bi-dimensional image associated with the second encoded file, and a reference to the second tree.

2. The method of claim 1, further comprising:
storing a first weight table comprising the respective first frequency for each character in the plurality of characters in the source file; and
storing a second weight table comprising the respective second frequency for each of the placeholder values in the first encoded file.

3. The method of claim 1, further comprising:
determining the bi-dimensional image based on the second encoded file, wherein the bi-dimensional image comprises a colored image;
transmitting the package comprising the bi-dimensional image;
extracting the second encoded file from the bi-dimensional image; and
decoding the second encoded file using the first tree and second tree to rebuild the source file,
wherein the bi-dimensional image includes a visual property that includes information associated with the second encoded file.

4. The method of claim 3, further comprising:
detecting, via one or more sensors, the bi-dimensional image;
extracting the second encoded file from the bi-dimensional image; and
decoding the second encoded file using the first tree and second tree to rebuild the source file.

5. The method of claim 1, wherein determining the first tree corresponding to the source file comprises:
creating a plurality of first tree nodes corresponding to the plurality of characters in the source file, wherein each first tree node includes the respective first frequency for a corresponding character;
determining a first child node having a first minimum first frequency and a second child node having a second minimum first frequency from the plurality of first tree nodes;
combining the first child node and the second child node to create a parent node, wherein a frequency for the parent node is a sum of the first minimum first frequency and the second minimum first frequency;
referencing the parent node in the first tree; and
repeating the steps of determining the first child node and the second child node, combining the first child node and the second child node, and referencing the parent node until each one of the plurality of first tree nodes is referenced in the first tree.

6. The method of claim 1, wherein the package further comprises an encryption key based on a branch of the second tree.

7. The method of claim 1, further comprising:
receiving a second source file; and
encoding the second source file using at least one of the first tree and the second tree.

8. A system comprising:
a communications interface;
a memory; and
one or more processors configured to perform a method comprising:
receiving, via the communications interface, a source file comprising a plurality of characters;
determining a respective first frequency for each character of the plurality of characters of the source file;
determining a first tree corresponding to the source file based on the respective first frequencies;
encoding the source file using the first tree to generate a first encoded file;
in accordance with a determination that the total number of bits in the first encoded file is not a multiple of a first segment length, appending the first encoded file with one or more bits so that a new total number of bits in the first encoded file is a multiple of the first segment length;
in accordance with a determination that the total number of bits in the first encoded file is a multiple of the first segment length, forgoing appending the first encoded file with one or more bits;
dividing the first encoded file into one or more segments, each segment having the first segment length;
assigning a placeholder value to each of the one or more segments;
determining a respective second frequency for each of the placeholder values in the first encoded file;
determining, based on the respective second frequencies, a second tree corresponding to the first encoded file;
encoding the first encoded file using the second tree to generate a second encoded file;
generating a package comprising: a bi-dimensional image associated with the second encoded file, and a reference to the second tree; and
storing the package in the memory.

9. The system of claim 8, the method further comprising:
storing, in the memory, a first weight table comprising the first frequency for each character in the plurality of characters in the source file; and
storing, in the memory, a second weight table comprising the second frequency for each of the placeholder characters in the first encoded file.

10. The system of claim 8, the method further comprising:
determining the bi-dimensional image based on the second encoded file, wherein the bi-dimensional image comprises a colored image;
transmitting, via the communications interface, the package comprising the bi-dimensional image;
extracting the second encoded file from the bi-dimensional image; and
decoding the second encoded file using the first tree and second tree to rebuild the source file, wherein the bi-dimensional image includes a visual property that includes information associated with the second encoded file.

11. The system of claim 10, the method further comprising:
detecting, via one or more sensors of the system, the bi-dimensional image;

extracting the second encoded file from the bi-dimensional image; and decoding the second encoded file using the first tree and second tree to rebuild the source file.

12. The system of claim 8, wherein determining the first tree corresponding to the source file comprises:

creating a plurality of first tree nodes corresponding to the plurality of characters in the source file, wherein each first tree node includes the first frequency for a corresponding character;

determining a first child node having a first minimum first frequency and a second child node having a second minimum first frequency from the plurality of first tree nodes;

combining the first child node and the second child node to create a parent node, wherein a frequency for the parent node is a sum of the first minimum first frequency and the second minimum first frequency;

referencing the parent node in the first tree; and repeating the steps of determining the first child node and the second child node, combining the first child node and the second child node, and referencing the parent node until each one of the plurality of first tree nodes is referenced in the first tree.

13. The system of claim 8, wherein the package further comprises an encryption key based on a branch of the second tree.

14. The system of claim 8, the method further comprising:
receiving, via the communications interface, a second source file; and
encoding the second source file using at least one of the first tree and the second tree.

15. A non-transitory computer-readable medium storing instructions which, when executed by one or more processors, cause the one or more processors to perform a method comprising:

receiving a source file comprising a plurality of characters;

determining a respective first frequency for each character of the plurality of characters of the source file;

determining a first tree corresponding to the source file based on the respective first frequencies;

encoding the source file using the first tree to generate a first encoded file;

in accordance with a determination that the total number of bits in the first encoded file is not a multiple of a first segment length, appending the first encoded file with one or more bits so that a new total number of bits in the first encoded file is a multiple of the first segment length;

in accordance with a determination that the total number of bits in the first encoded file is a multiple of the first segment length, forgoing appending the first encoded file with one or more bits;

dividing the first encoded file into one or more segments, each segment having the first segment length;

assigning a placeholder value to each of the one or more segments;

determining a respective second frequency for each of the placeholder values in the first encoded file;

determining, based on the respective second frequencies, a second tree corresponding to the first encoded file;

encoding the first encoded file using the second tree to generate a second encoded file; and generating a package comprising: a bi-dimensional image associated with the second encoded file, and a reference to the second tree.

16. The non-transitory computer-readable medium of claim 15, wherein the package further comprises an encryption key based on a branch of the second tree.

17. The non-transitory computer-readable medium of claim 16, the method further comprising:

determining the bi-dimensional image based on the second encoded file, wherein the bi-dimensional image comprises a colored image;

transmitting, via a communications interface, the package comprising the bi-dimensional image;

extracting the second encoded file from the bi-dimensional image; and decoding the second encoded file using the first tree and second tree to rebuild the source file, wherein the bi-dimensional image includes a visual property that includes information associated with the second encoded file.

18. The non-transitory computer-readable medium of claim 17, the method further comprising:

detecting, via one or more sensors, the bi-dimensional image;

extracting the second encoded file from the bi-dimensional image; and decoding the second encoded file using the first tree and second tree to rebuild the source file.

19. The non-transitory computer-readable medium of claim 15, wherein determining the first tree corresponding to the source file comprises:

creating a plurality of first tree nodes corresponding to the plurality of characters in the source file, wherein each first tree node includes the first frequency for a corresponding character;

determining a first child node having a first minimum first frequency and a second child node having a second minimum first frequency from the plurality of first tree nodes;

combining the first child node and the second child node to create a parent node, wherein a frequency for the parent node is a sum of the first minimum first frequency and the second minimum first frequency;

referencing the parent node in the first tree; and repeating the steps of determining the first child node and the second child node, combining the first child node and the second child node, and referencing the parent node until each one of the plurality of first tree nodes is referenced in the first tree.

20. The non-transitory computer-readable medium of claim 15, the method further comprising:
receiving, via a communications interface, a second source file; and
encoding the second source file using at least one of the first tree and the second tree.

* * * * *